United States Patent
Lee et al.

(10) Patent No.: US 10,964,365 B2
(45) Date of Patent: Mar. 30, 2021

(54) SEMICONDUCTOR APPARATUS, SEMICONDUCTOR SYSTEM, AND TRAINING METHOD

(71) Applicant: SK hynix Inc., Icheon-si (KR)

(72) Inventors: Dong Uk Lee, Seoul (KR); Dong Kyun Kim, Cheongju-si (KR); Min Su Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/780,622

(22) Filed: Feb. 3, 2020

(65) Prior Publication Data

US 2020/0176040 A1 Jun. 4, 2020

Related U.S. Application Data

(62) Division of application No. 15/815,939, filed on Nov. 17, 2017, now Pat. No. 10,586,577.

(30) Foreign Application Priority Data

Dec. 15, 2016 (KR) .......................... 10-2016-0171865

(51) Int. Cl.
  *G11C 8/18* (2006.01)
  *G11C 7/22* (2006.01)
  *G11C 29/02* (2006.01)

(52) U.S. Cl.
  CPC ................ *G11C 8/18* (2013.01); *G11C 7/222* (2013.01); *G11C 29/023* (2013.01); *G11C 29/028* (2013.01)

(58) Field of Classification Search
  CPC .......... G11C 8/18; G11C 7/222; G11C 29/023
  USPC ........................................................ 365/193
  See application file for complete search history.

(56) References Cited

U.S. PATENT DOCUMENTS

| | | | |
|---|---|---|---|
| 6,836,166 B2 | 12/2004 | Lin et al. | |
| 8,593,195 B1 | 11/2013 | Huang et al. | |
| 9,021,154 B2 | 4/2015 | Morris et al. | |
| 2012/0137084 A1* | 5/2012 | Ok ........................ | G11C 7/1093 711/154 |
| 2016/0103763 A1 | 4/2016 | Chen et al. | |
| 2018/0174633 A1 | 6/2018 | Lee et al. | |

FOREIGN PATENT DOCUMENTS

| | | |
|---|---|---|
| CN | 1797953 A | 7/2006 |
| CN | 1851821 A | 10/2006 |
| CN | 104810047 A | 7/2015 |
| CN | 104851445 A | 8/2015 |
| CN | 111161780 A | 5/2020 |
| KR | 1020060135290 A | 12/2006 |
| KR | 1020100130335 A | 12/2010 |

* cited by examiner

*Primary Examiner* — Anthan Tran
(74) *Attorney, Agent, or Firm* — William Park & Associates Ltd.

(57) ABSTRACT

A semiconductor apparatus may be provided. The semiconductor apparatus may include a fine training circuit configured to generate a fine result signal based on a clock signal, a data strobe signal, and a command. The semiconductor apparatus may include a coarse training circuit configured to generate a coarse result signal based on the clock signal, the data strobe signal, and the command and to set an offset of a write enable signal based on an offset control signal.

5 Claims, 5 Drawing Sheets

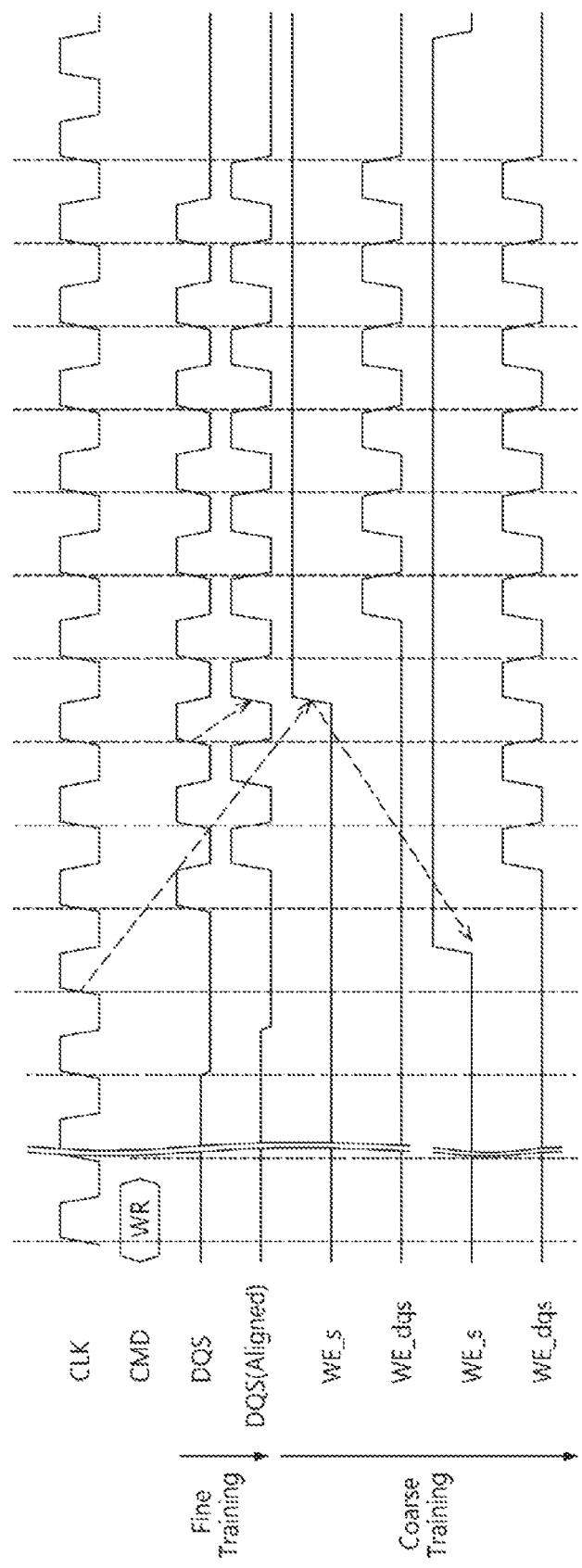

SEMICONDUCTOR APPARATUS, SEMICONDUCTOR SYSTEM, AND TRAINING METHOD

CROSS-REFERENCES TO RELATED APPLICATION

The present application is a divisional application of U.S. patent application Ser. No. 15/815,939, filed on Nov. 17, 2017, and claims priority under 35 U.S.C. § 119(a) to Korean application number 10-2016-0171865, filed on Dec. 15, 2016, in the Korean Intellectual Property Office, which is incorporated herein by reference in its entirety.

BACKGROUND

1. Technical Field

Various embodiments may generally relate to a semiconductor device, and, more particularly, to a semiconductor apparatus, a semiconductor system, and a training method.

2. Related Art

A semiconductor apparatus may receive a signal from an exterior (for example, from a controller) and operates in accordance with the received signal. Operation speeds of the semiconductor apparatus may increase, however, the semiconductor apparatus is still designed to receive a signal in synchronization with a semiconductor memory apparatus clock signal and operate in synchronization with the clock signal.

Thus, the semiconductor apparatus is trained to normally operate in synchronization with the dock signal, so that the training result is applied to the semiconductor apparatus.

SUMMARY

In an embodiment, a semiconductor apparatus may be provided. The semiconductor apparatus may include a fine training circuit configured to generate a fine result signal based on a clock signal, a data strobe signal, and a command. The semiconductor apparatus may include a coarse training circuit configured to generate a coarse result signal based on the clock signal, the data strobe signal, and the command and to set an offset of a write enable signal based on an offset control signal.

In an embodiment, a semiconductor system may be provided. The semiconductor system may include a controller configured to output a clock signal, a command, a data strobe signal, and an offset control signal and receive a fine result signal and a coarse result signal. The semiconductor system may include a semiconductor apparatus configured to generate and output the fine result signal and the coarse result signal based on the clock signal, the command, and the data strobe signal, and decide an output timing of a write enable signal based on the offset control signal.

In an embodiment, a training method may be provided. The training method may include comparing phases of a data strobe signal and a write command with each other. The training method may include changing an output timing of the data strobe signal according to a result obtained by comparing the phases and comparing the phases with each other again. The training method may include generating a write enable signal based on the write command when the phases are substantially equal to each other. The training method may include counting the data strobe signal for an enable period of the write enable signal. The training method may include outputting a result of the counting to a controller. The training method may include receiving an offset control signal generated according to the result of the counting from the controller and setting an offset of the write enable signal.

In an embodiment, a semiconductor apparatus may be provided. The semiconductor apparatus may include a fine training circuit configured to compare phases of a command and a data strobe signal until the phase of the command is aligned with the phase of the data strobe signal. The semiconductor apparatus may include a coarse training circuit configured to generate a write enable signal based on the command and to set an offset of the write enable signal based on an offset control signal. The offset control signal may be generated according to a counting result of the aligned data strobe signal during an enable period of the write enable signal.

BRIEF DESCRIPTION OF THE DRAWINGS

FIG. 5 is a timing chart for explaining an operation of a semiconductor apparatus in accordance with an embodiment.

DETAILED DESCRIPTION

Hereinafter, a semiconductor apparatus, a semiconductor system, and a training method thereof will be described below with reference to the accompanying drawings through various examples of embodiments.

Figure 1:
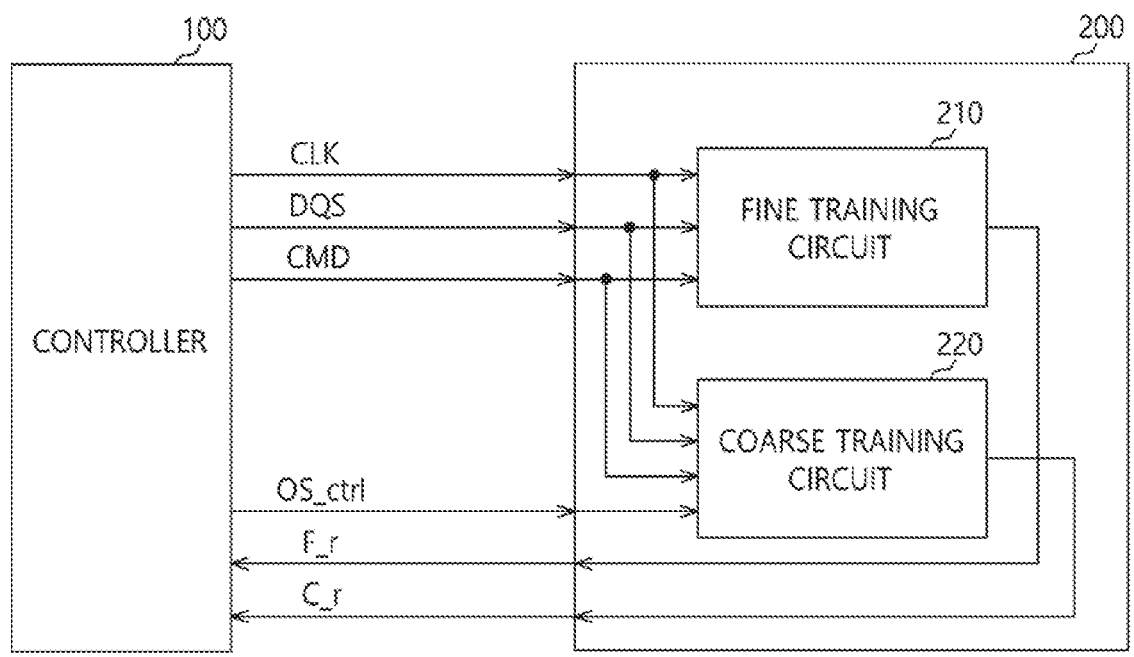
FIG. 1 is a configuration diagram of a semiconductor system in accordance with an embodiment.

Referring to FIG. 1, a semiconductor system in accordance with an embodiment may include a controller 100 and a semiconductor apparatus 200. In an embodiment, for example, a semiconductor device may include a semiconductor system.

The controller 100 may provide a clock signal CLK, a data strobe signal DQS, a command CMD (signal), and an offset control signal OS_ctrl, and receive a fine result signal F_r and a coarse result signal C_r. For example, the controller 100 may adjust an output timing of the data strobe signal DQS in response to the fine result signal F_r provided from a semiconductor apparatus having performed a fine training operation by the clock signal CLK, the data strobe signal DQS, and the command CMD. Furthermore, the controller 100 may generate the offset control signal OS_ctrl in response to the coarse result signal C_r provided from the semiconductor apparatus having performed a coarse training operation by the clock signal CLK, the data strobe signal DQS, and the command CMD.

The semiconductor apparatus 200 may perform preset operations in response to the clock signal CLK, the data strobe signal DQS, the command CMD, and the offset control signal OS_ctrl, and provide results of the operations to the controller 100 as the fine result signal F_r and the coarse result signal C_r. For example, the semiconductor apparatus 200 may perform the fine training operation in response to the clock signal CLK, the data strobe signal DQS, and the command CMD, and provide the fine training result to the controller 100 as the fine result signal F_r. The semiconductor apparatus 200 may perform the coarse training operation in response to the clock signal CLK, the data strobe signal DQS, and the command CMD, and provide the coarse training result to the controller 100 as the coarse result signal C_r. Furthermore, the semiconductor apparatus 200 may set an output timing (that is, an offset) of a signal (for example, a write enable signal WE_s illustrated in FIG. 3) internally generated by the command CMD in response to the offset control signal OS_ctrl.

The semiconductor apparatus 200 may include a fine training circuit 210 and a coarse training circuit 220.

The fine training circuit 210 may generate the fine result signal F_r in response to the command CMD, to the clock signal CLK, and the data strobe signal DQS. For example, the fine training circuit 210 may allow the command CMD to be synchronized with the clock signal CLK, compare the phases of the command CMD synchronized with the clock signal CLK and the data strobe signal DQS with each other, and output the phase comparison result as the fine result signal F_r.

The coarse training circuit 220 may generate the coarse result signal C_r in response to the command CMD, to the clock signal CLK, and the data strobe signal DQS. For example, the coarse training circuit 220 may generate the write enable signal WE_s in response to the clock signal CLK and the command CMD, count a rising edge (or a falling edge) of the data strobe signal DQS during an enable period of the write enable signal WE_s, and output the counting result as the coarse result signal C_r.

Figure 2:
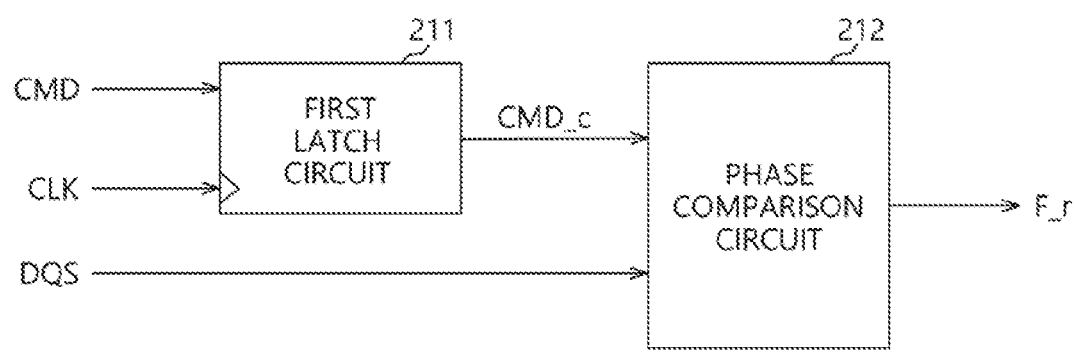
FIG. 2 is a configuration diagram of a fine training circuit of FIG. 1.

The fine training circuit 210 may include a first latch circuit 211 and a phase comparison circuit 212 as illustrated in FIG. 2.

The first latch circuit 211 may allow the command CMD to be synchronized with the clock signal CLK and output a latch command CMD_c (signal). The first latch circuit 211 may allow the command CMD to be synchronized with the clock signal CLK to thereby generate a latch command CMD_c.

The phase comparison circuit 212 may compare the phases of the latch command CMD_c and the data strobe signal DQS with each other, and output the phase comparison result as the fine result signal F_r. The phase comparison circuit 212 may compare the phases of the latch command CMD_c and the data strobe signal DQS with each other to generate the fine result signal F_r. In this case, the command CMD may be a write command for performing a write operation. For example, when the level of the data strobe signal DQS is a high level at a rising timing of the latch command CMD_c, the phase comparison circuit 212 may output the fine result signal F_r at a high level. When the level of the data strobe signal DQS is a low level at the rising timing of the latch command CMD_c, the phase comparison circuit 212 may output the fine result signal F_r at a low level.

Figure 3:
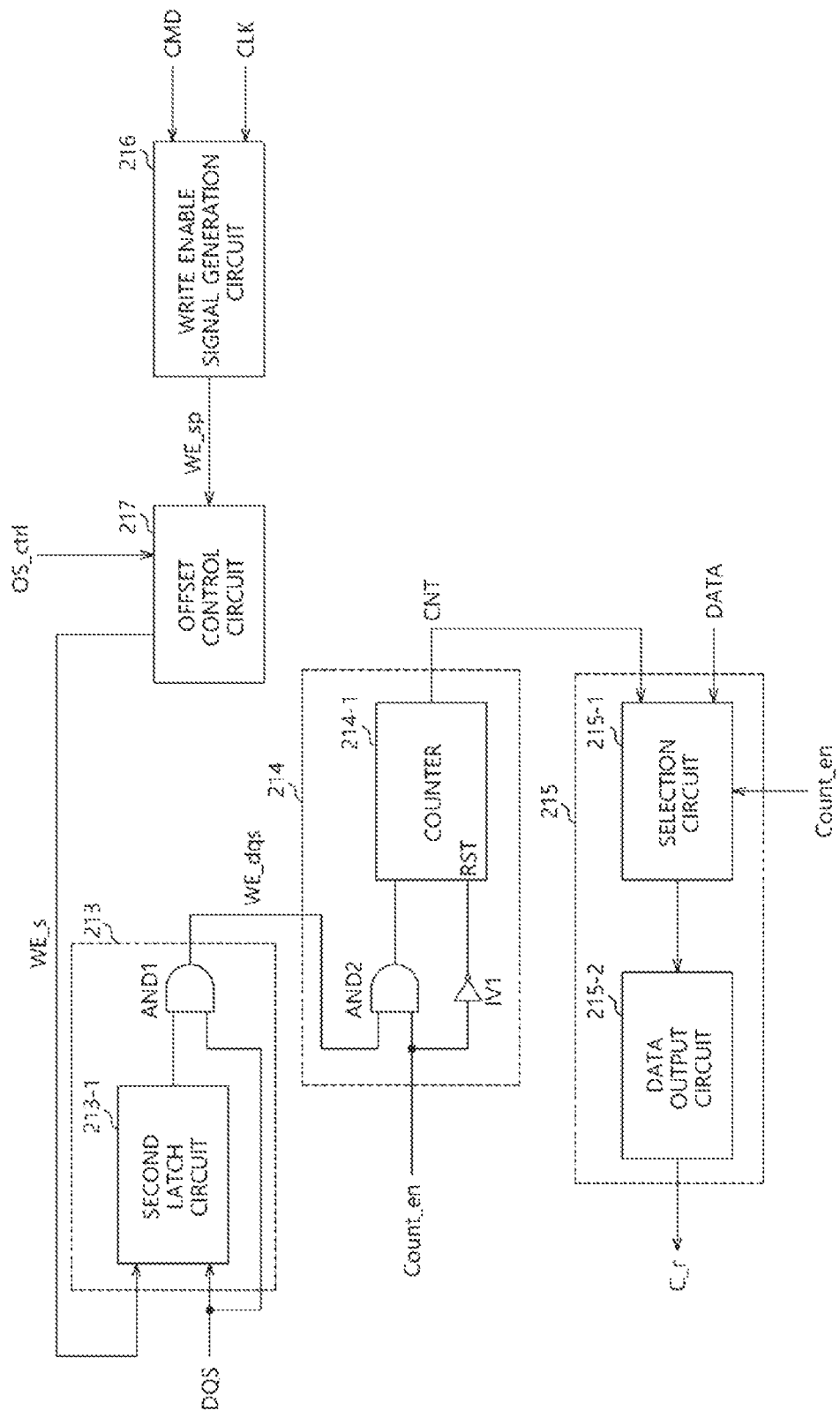
FIG. 3 is a configuration diagram of a coarse training circuit of FIG. 1.

The coarse training circuit 220 may include a write enable signal generation circuit 216, an offset control circuit 217, a counting input signal generation circuit 213, a counting circuit 214, and a training result output circuit 215 as illustrated in FIG. 3.

The coarse training circuit 220 may generate a preliminary write enable signal WE_sp in response to the command CMD and the clock signal CLK.

The offset control circuit 217 may delay the preliminary write enable signal WE_sp in, for example, units of one cycle of the clock signal CLK in response to the offset control signal OS_ctrl, thereby outputting the write enable signal WE_s. For example, the offset control circuit 217 may change a delay amount of the output timing of the preliminary write enable signal WE_sp in units of one cycle of the clock signal CLK in response to the offset control signal OS_ctrl, thereby outputting the delayed signal as the write enable signal WE_s. The offset control circuit 217 has an initial delay amount, and the initial delay amount may be changed in response to the offset control signal OS_ctrl.

The counting input signal generation circuit 213 may allow the data strobe signal DQS to pass therethrough only for the enable period of the write enable signal WE_s, thereby generating a counting input signal WE_dqs. For example, the counting input signal generation circuit 213 allows the data strobe signal DQS to pass therethrough only for the enable period of the write enable signal WE_s, and outputs the passed-through data strobe signal DQS as the counting input signal WE_dqs.

The counting input signal generation circuit 213 includes a second latch circuit 213-1 and may perform a logic operation. In an embodiment, for example the counting input signal generation circuit 213 may include a logic gate and may perform an AND operation. In an embodiment, for example, the logic gate for performing the AND operation may include a first AND gate AND1. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

The second latch circuit 213-1 receives the write enable signal WE_s through a signal input terminal thereof, and receives the data strobe signal DQS through a clock input terminal thereof. For example, the second latch circuit 213-1 may output the write enable signal WE_s in synchronization with the data strobe signal DQS.

The first AND gate AND1 may perform an AND operation on the output signal of the second latch circuit 213-1 and the data strobe signal DQS, thereby outputting the counting input signal WE_dqs. The first AND gate AND1 may receive the output signal of the second latch circuit 213-1 and the data strobe signal DQS, and to output the counting input signal WE_dqs. That is, the first AND gate AND1 may output the data strobe signal DQS only for an enable period of the output signal of the second latch circuit 213-1, thereby generating the counting input signal WE_dqs.

The counting circuit 214 may count a rising edge (or a falling edge) of the counting input signal WE_dqs in response to a counting enable signal Count_en, and output the counting result as a count signal CNT.

The counting circuit 214 may include a counter 214-1 and may perform inversion and AND operations. In an embodiment, for example the counting circuit 214 may include a logic gates and may perform the AND and inversion operations. In an embodiment, for example, the logic gate for performing the AND operation may include a second AND gate AND2. In an embodiment, for example, the logic gate for performing the inversion operation may include an inverter IV1. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations. The second AND gate AND2 receives the counting input signal WE_dqs and the counting enable signal Count_en. The inverter IV1 receives the counting enable signal Count_en. The counter 214-1 may receive an output signal of the inverter IV1 through a reset terminal thereof, receive an output signal of the second AND gate AND2 through a signal input terminal thereof, and output the count signal CNT through an output terminal thereof. The counter 214-1 may count the output signal of the second AND gate AND2 in response to the output signal of the inverter IV1, and output the counting result as the count signal CNT or initialize the count signal CNT.

The counting circuit 214 configured as above may count the rising edge (or the falling edge) of the counting input signal WE_dqs when the counting enable signal Count_en is enabled, and output the counting result as the count signal CNT. In an embodiment, for example, the counting circuit 214 may be configured to perform a counting operation when the counting enable signal Count_en is enabled. When the counting enable signal Count_en is disabled, the counting circuit 214 may initialize the count signal CNT.

The training result output circuit 215 may output one of the count signal CNT and data DATA in response to the counting enable signal Count_en. For example, when the counting enable signal Count_en is enabled, the training result output circuit 215 may output the count signal CNT of the count signal CNT and the data DATA as the coarse result signal C_r. When the counting enable signal Count_en is disabled, the training result output circuit 215 may output the data DATA of the count signal CNT and the data DATA. The data DATA may be a signal outputted from a data storage area.

The training result output circuit 215 may include a selection circuit 215-1 and a data output circuit 215-2.

The selection circuit 215-1 may output one of the count signal CNT and the data DATA in response to the counting enable signal Count_en. For example, when the counting enable signal Count_en is enabled, the selection circuit 215-1 may output the count signal CNT. When the counting enable signal Count_en is disabled, the selection circuit 215-1 may output the data DATA. In this case, the selection circuit 215-1 may be, for example, a multiplexer.

The data output circuit 215-2 may be a circuit that outputs an output signal of the selection circuit 215-1 to an exterior of the semiconductor apparatus. For example, the data output circuit 215-2 may include a circuit that changes a parallel signal to a serial signal. The data output circuit 215-2 may output the coarse result signal C_r when the training operation of the semiconductor apparatus is performed.

The operations of the semiconductor apparatus and the semiconductor system configured as above in accordance with an embodiment, and the training method will be described.

The operations of the semiconductor apparatus in accordance with an embodiment are as follows.

The semiconductor apparatus 200 in accordance with an embodiment may generate and output the fine result signal and the coarse result signal C_r in response to the clock signal CLK, the data strobe signal DQS, and the command CMD, and control the enabling timing, that is, the output timing of the write enable signal WE_s in response to the offset control signal OS_ctrl.

For example, the fine training circuit 210 of the semiconductor apparatus 200 allows the command CMD to be synchronized with the clock signal CLK, compares the phases of the command CMD synchronized with the clock signal CLK and the data strobe signal DQS with each other, and outputs the fine result signal F_r.

The first latch circuit 211 of FIG. 2 allows the clock signal CLK and the command CMD to be synchronized with each other, and the phase comparison circuit 212 compares the phases of the output of the first latch circuit 211 and the data strobe signal DQS with each other and outputs the fine result signal F_r.

The coarse training circuit 220 of the semiconductor apparatus 200 generates the write enable signal WE_s in response to the command CMD and the clock signal CLK, counts the rising edge (or the falling edge) of the data strobe signal DQS during the enable period of the write enable signal WE_s, and outputs the counting result as the coarse result signal C_r.

The coarse training circuit 220 of the semiconductor apparatus 200 controls the enable timing of the write enable signal WE_s, that is, the output timing of the write enable signal WE_s in response to the offset control signal OS_ctrl.

The write enable signal generation circuit 216 of FIG. 3 generates the preliminary write enable signal WE_sp in response to the command CMD and the clock signal CLK, and the offset control circuit 217 delays the preliminary write enable signal WE_sp by a delay amount based on the offset control signal OS_ctrl and outputs the write enable signal WE_s. In an embodiment, for example, the offset control circuit 217 may be configured to decide an output timing of the preliminary write enable signal WE_sp based on the offset control signal OS_ctrl and output the write enable signal WE_s. The counting input signal generation circuit 213 allows the data strobe signal DQS to pass therethrough only for the enable period of the write enable signal WE_s and outputs the counting input signal WE_dqs, and the counting circuit 214 counts the rising edge (or the falling edge) of the counting input signal WE_dqs and outputs the count signal CNT. The training result output circuit 215 outputs the count signal CNT as the coarse result signal C_r, instead of the data DATA, in the training operation.

In the training operation, the semiconductor apparatus 200 operates as above, and the operation of the controller 100 according to the output signals of the semiconductor apparatus 200 will be described below.

The controller 100 changes the output timing of the data strobe signal DQS in response to the fine result signal F_r.

The controller 100 generates the offset control signal OS_ctrl in response to the coarse result signal C_r.

The training operation of the semiconductor system including the semiconductor apparatus and the controller operating as above will be described below.

The controller 100 provides the semiconductor apparatus 200 with the clock signal CLK, the data strobe signal DQS, and the command CMD.

The semiconductor apparatus 200 allows the command CMD (for example, a write command) to be synchronized with the clock signal CLK, compares the phases of the synchronized command CMD_c and the data strobe signal DQS with each other, and provides the fine result signal F_r to the controller 100. The aforementioned operation of the semiconductor apparatus 200 is the operation of the fine training circuit 210 included in the semiconductor apparatus 200.

The controller 100 changes the output timing of the data strobe signal DQS in response to the fine result signal F_r.

The controller 100 and the semiconductor apparatus 200 repeat the fine training operation in which the controller 100 provides the semiconductor apparatus 200 with the command CMD, the clock signal CLK, and the data strobe signal DQS in response to the fine result: signal F_r until the phases of the command CMD and the data strobe signal DQS are substantially equal to each other, and the semiconductor apparatus 200 provides the phase comparison result the controller 100 as the fine result signal F_r.

When the phases of the command CMD and the data strobe signal DQS received in the semiconductor apparatus 200 match with each other, the semiconductor apparatus 200 ends the fine training operation.

When the fine training operation is ended, the semiconductor apparatus 200 starts the coarse training operation. The coarse training operation is the operation of the coarse training circuit 220 of the semiconductor apparatus 200.

The controller 100 provides the semiconductor apparatus 200 with the clock signal CLK, the data strobe signal DQS, and the command CMD according to the fine training result.

The coarse training circuit 220 of the semiconductor apparatus 200 generates the preliminary write enable signal WE_sp in response to the command CMD and the clock signal CLK, and delays the preliminary write enable signal WE_sp by a basic delay amount in response to the offset control signal OS_ctrl, thereby generating the write enable signal WE_s. The coarse training circuit 220 generates the counting input signal WE_dqs by allowing the data strobe signal DQS to pass therethrough only for the enable period of the write enable signal WE_s, and counts the rising edge (or the falling edge) of the counting input signal WE_dqs to generate the count signal CNT. The coarse training circuit 220 provides the controller 100 with the count signal CNT as the coarse result signal C_r, and the controller 100 generates the offset control signal OS_ctrl in response to the coarse result signal C_r and provides the semiconductor apparatus 200 with the offset control signal OS_ctrl. The semiconductor apparatus 200 decreases or increases the delay amount of the basis delay amount in units of one cycle of the clock signal CLK in response to the offset control signal OS_ctrl, thereby controlling the output timing of the write enable signal WE_s.

The fine training operation and the coarse training operation will be described in below.

The controller 100 provides the semiconductor apparatus 200 with the command CMD, the clock signal CLK periodically transitioned, and the data strobe signal DQS including a preset number of rising edges.

The semiconductor apparatus 200 generates the latch command CMD_c by allowing the clock signal CLK and the command CMD to be synchronized with each other, compares the phase of the latch command CMD_c with the phase of the data strobe signal DQS, and provides coincidence or non-coincidence of the phases to the controller 100 as the fine result signal F_r.

The controller 100 changes the output timing of the data strobe signal DQS in response to the fine result signal F_r until the phase of the latch command CMD_c and the phase of the data strobe signal DQS are substantially equal to each other.

Since the fine training operation is an operation for allowing the phases of the command CMD and the data strobe signal DQS received in the semiconductor apparatus 200 to be substantially equal to each other, even though the phases of the command CMD and the data strobe signal DQS are substantially equal to each other through the fine training operation, it is not possible to determine a rising edge, at which the command CMD has matched, among a preset number of rising edges of the data strobe signal DQS.

Accordingly, after the fine training operation is completed, the coarse training operation is performed.

After the fine training operation is completed, the output timing of the data strobe signal DQS is decided by the controller 100, and the controller 100 provides the semiconductor apparatus 200 with the clock signal CLK, the data strobe signal DQS, and the command CMD for the coarse training operation even after the fine training operation is completed.

In the coarse training operation, the write enable signal WE_s is generated in response to the command CMD and the clock signal CLK, the number of the rising edges of the data strobe signal DQS is counted for the enable period of the write enable signal WE_s, and the counting result is provided to the controller 100 again as the coarse result signal C_r. The controller 100 generates the offset control signal OS_ctrl in response to the coarse result signal C_r such that the controller 100 is able to control the output timing of the write enable signal WE_s generated in the semiconductor apparatus 200. The semiconductor apparatus 200 changes the output timing of the write enable signal WE_s in response to the offset control signal OS_ctrl, counts the preset number of rising edges of the data strobe signal DQS inputted from the controller 100, counts the offset control signal OS_ctrl such that all the rising edges included in the data strobe signal DQS are counted, and provides the counting result to the controller 100 as the coarse result signal C_r.

Figure 4:
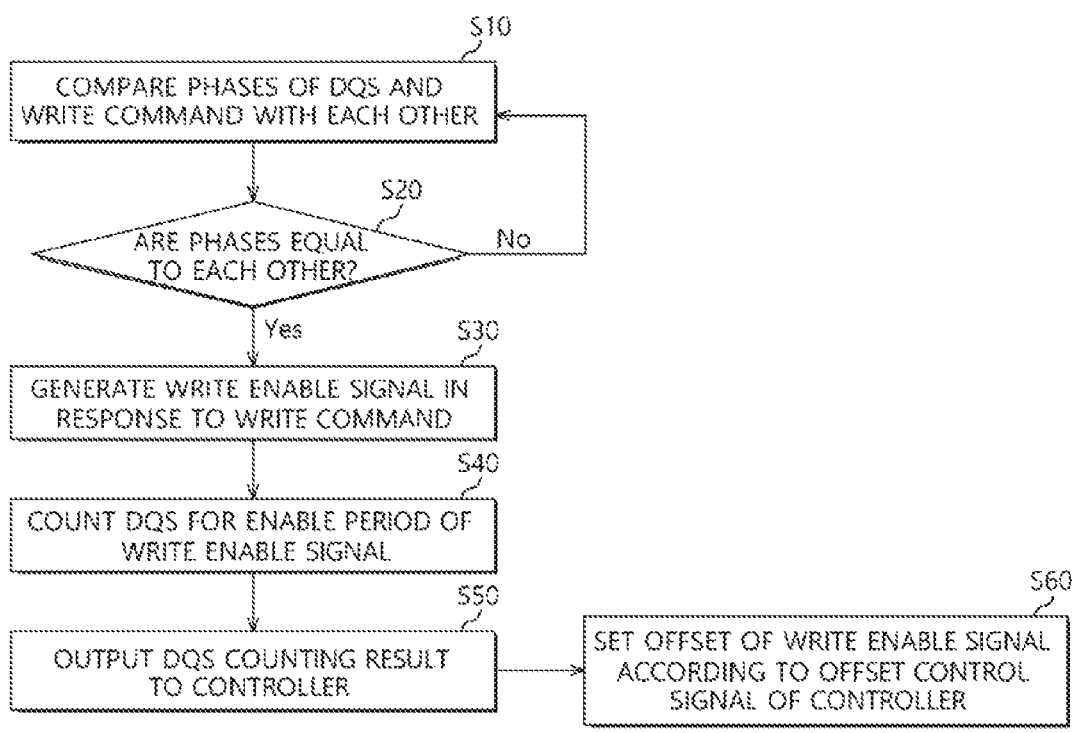
FIG. 4 is a flowchart illustrating a training method of a semiconductor apparatus in accordance with an embodiment.

The fine training operation and the coarse training operation as described above will be briefly described with reference to FIG. 4 and FIG. 5.

The phases of the data strobe signal DQS and the command CMD (for example, a write command (i.e., WR)) are compared with each other (S10), the controller 100 changes the output timing of the data strobe signal DQS when the phases are not substantially equal to each other (No) according to the phase comparison result, and the semiconductor apparatus 200 compares the phases of the data strobe signal DQS and the command CMD with each other again (S20).

When the phases of the command CMD and the data strobe signal DQS are substantially equal to each other (Yes), that is, when the data strobe signal DQS is aligned by the command CMD synchronized with the clock signal CLK, the fine training operation is ended and the coarse training operation is started.

The write enable signal WE_s is generated in response to the command CMD (for example, the write command) (530).

The rising edge (or the falling edge) of the data strobe signal DQS is counted for the enable period of the write enable signal WE_s (S40), the counting result is provided to the controller 100 (S50), and the controller 100 generates the offset control signal OS_ctrl according to the counting result (S60). The semiconductor apparatus 200 sets the output timing of the write enable signal WE_s, that is, an offset of the write enable signal WE_s in response to the offset control signal OS_ctrl.

For example, only the aligned data strobe signal DQS is inputted to the counter 214-1 as the counting input signal WE_dqs for the enable period of the write enable signal WE_s, and the counter 214-1 provides the counting result to the controller 100.

Referring to FIG. 5, when the enable timing of the write enable signal WE_s is delayed, the aligned data strobe signal sent from the controller 100 has nine rising edges, but the counting input signal WE_dqs has six rising edges. The counter 214-1 outputs a result, which is obtained by counting the six rising edges, to the controller 100, and the controller 100 controls an offset value of the phase comparison circuit 212 through the offset control signal OS_ctrl. That is, the controller 100 controls the phase comparison circuit 212 such that the enable timing of the write enable signal WE_s is advanced by three cycles of the clock signal CLK. The data strobe signal DQS is allowed to pass for the enable period of the write enable signal WE_s with the advanced enable timing, so that the counting input signal WE_dqs is generated. When the counting input signal WE_dqs has nine rising edges, the coarse training operation is ended.

White various embodiments have been described above, it will be understood to those skilled in the art that the embodiments described are examples only. Accordingly, the semiconductor apparatuses, the semiconductor systems, and the training methods described herein should not be limited based on the described embodiments.

What is claimed is:

1. A semiconductor apparatus comprising:
    a fine training circuit configured to compare phases of a command and a data strobe signal until the phase of the command is aligned with the phase of the data strobe signal; and
    a coarse training circuit configured to generate a write enable signal based on the command and to set an offset of the write enable signal based on an offset control signal,
    wherein the offset control signal is generated according to a counting result of an aligned data strobe signal during an enable period of the write enable signal.

2. The semiconductor apparatus according to claim 1, wherein the fine training circuit is configured to generate a fine result signal based on a clock signal, the data strobe signal, and the command.

3. The semiconductor apparatus according to claim 2, wherein the fine training circuit is configured to allow the command to be synchronized with the clock signal, and compare phases of the synchronized command and the data strobe signal with each other to generate the fine result signal.

4. The semiconductor apparatus according to claim 1, wherein the coarse training circuit is configured to generate a coarse result signal based on a clock signal, the data strobe signal, and the command and to set the offset of the write enable signal based on the offset control signal.

5. The semiconductor apparatus according to claim 4, wherein the coarse training circuit is configured to generate the write enable signal based on the command and the clock signal, count a rising edge or a falling edge of the data strobe signal for the enable period of the write enable signal, and output a counting result as the coarse result signal.

* * * * *